(12) United States Patent
Kim et al.

(10) Patent No.: US 7,902,007 B2
(45) Date of Patent: Mar. 8, 2011

(54) SEMICONDUCTOR SUBSTRATES AND MANUFACTURING METHODS OF THE SAME

(75) Inventors: Won-joo Kim, Hwaseong-si (KR); Tae-hee Lee, Yongin-si (KR); Dae-kil Cha, Seoul (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 12/219,360

(22) Filed: Jul. 21, 2008

(65) Prior Publication Data

US 2009/0212364 A1   Aug. 27, 2009

(30) Foreign Application Priority Data

Feb. 26, 2008  (KR) ................. 10-2008-0017419

(51) Int. Cl.
*H01L 21/84* (2006.01)

(52) U.S. Cl. .................. 438/164; 438/412; 257/E21.32

(58) Field of Classification Search ............... 438/412, 438/950; 257/E21.32
See application file for complete search history.

(56) References Cited

U.S. PATENT DOCUMENTS 6,277,703 B1 *  8/2001  Barlocchi et al. ............ 438/412
2006/0278926 A1 * 12/2006  Mathew et al. ............... 257/347

* cited by examiner

*Primary Examiner* — Chandra Chaudhari
(74) *Attorney, Agent, or Firm* — Harness, Dickey & Pierce, P.L.C.

(57) ABSTRACT

Semiconductor substrates and methods of manufacturing the same are provided. The semiconductor substrates include a substrate region, an insulation region and a floating body region. The insulation region is disposed on the substrate region. The floating body region is separated from the substrate region by the insulation region and is disposed on the insulation region. The substrate region and the floating body region are formed of materials having identical characteristics. The method of manufacturing the semiconductor substrate including forming at least one floating body pattern by etching a bulk substrate, separating the bulk substrate into a substrate region and a floating body region by etching a lower middle portion of the floating body pattern, and filling an insulating material between the floating body region and the substrate region.

19 Claims, 15 Drawing Sheets

SEMICONDUCTOR SUBSTRATES AND MANUFACTURING METHODS OF THE SAME

PRIORITY STATEMENT

This application claims the benefit of priority under 35 U.S.C. §119 from Korean Patent Application No. 10-2008-0017419, filed on Feb. 26, 2008 in the Korean Intellectual Property Office, the disclosure of which is incorporated herein in its entirety by reference.

BACKGROUND

1. Field

Example embodiments provide semiconductor substrates and methods of manufacturing a semiconductor substrate. Other example embodiments relate to semiconductor substrates including a floating body and methods of manufacturing a semiconductor substrate.

2. Description of the Related Art

Generally, a 1-T dynamic random access memory (DRAM), which does not include a capacitor and uses one transistor, may be used. A 1-T DRAM may be manufactured using a fairly simple manufacturing process. A 1-T DRAM may have an increased sensing margin.

If a 1-T DRAM is realized on a silicon-on-insulator (SOI) wafer, the manufacturing cost increases due to the SOI wafer. 1-T DRAMs are generally manufactured in an embedded form.

SUMMARY

Example embodiments provide semiconductor substrates and methods of manufacturing a semiconductor substrate. Other example embodiments relate to semiconductor substrates including a floating body and methods of manufacturing a semiconductor substrate.

Example embodiments provide a method of manufacturing a semiconductor device in which a floating body region formed of a same material as a substrate region is realized using a selective etching technique.

According to example embodiments, there is provided a semiconductor substrate including a substrate region, an insulation region formed on the substrate region, and a floating body region separated from the substrate region by the insulation region and disposed on the insulation region, wherein the substrate region and the floating body region are formed of materials having identical characteristics. The substrate region may be formed from a bulk semiconductor substrate.

According to example embodiments, there is provided a method of manufacturing a semiconductor substrate including forming at least one floating body pattern by etching a bulk substrate, separating (or defining) the bulk substrate into a substrate region and a floating body region by etching a lower middle portion of the floating body pattern, and filling an insulating material between the floating body region and the substrate region.

In separating the bulk substrate into the substrate region and the floating body region by etching the lower middle portion of the floating body pattern, the lower middle portion of the floating body pattern may be etched using a selective wet or dry etching method.

Forming the at least one floating body pattern by etching the bulk substrate may include etching the bulk substrate in a first direction, which is a major axis direction, to form a floating body line pattern extending in the first direction, filling sides of the floating body line pattern with an insulating layer, and etching the floating body line pattern and the insulating layer in a second direction perpendicular to the first direction, in which the floating body line pattern is extended, to form at least one floating body pattern that is extended in the second direction.

Separating the bulk substrate into the substrate region and the floating body region by etching a lower middle portion of the floating body pattern may include forming a passivation layer on sidewalls of the floating body pattern, and etching the lower middle portion of the floating body pattern through a bottom surface disposed on sides of the floating body pattern where the passivation layer is not formed.

Forming the at least one floating body pattern by etching the bulk substrate may include etching the bulk substrate in a first direction to form a plurality of floating body line patterns extending parallel to each other in the first direction, filling an insulating layer between the floating body line patterns, and etching the bulk substrate in a second direction perpendicular to the first direction, in which the floating body line patterns are extended, to form a plurality of floating body patterns extending parallel to each other in the second direction.

Separating the bulk substrate into the substrate region and the floating body region by etching the lower middle portion of the floating body pattern, may include forming a passivation layer on sidewalls of the floating body patterns, and etching the lower middle portion of the floating body patterns through a bottom surface where the passivation layer that is disposed between the floating body patterns is not formed.

BRIEF DESCRIPTION OF THE DRAWINGS

Example embodiments will be more clearly understood from the following detailed description taken in conjunction with the accompanying drawings. FIGS. 1-12F represent non-limiting, example embodiments as described herein.

FIG. 1 is a perspective view of a semiconductor substrate according to example embodiments;

FIG. 2 illustrates a substrate region and a body region in the semiconductor substrate of FIG. 1;

FIG. 3 illustrates an oxide region filled between the substrate region and the body region of FIG. 2;

FIG. 4 illustrates a semiconductor substrate according to example embodiments.

FIG. 5 illustrates a semiconductor substrate according to example embodiments;

FIG. 7 illustrates a word line pattern formed in a semiconductor substrate 400 according to example embodiments;

FIG. 9 is a perspective view of a semiconductor substrate according to example embodiments;

FIG. 10 illustrates a substrate region and a body region in the semiconductor substrate of FIG. 9;

FIG. 11 illustrates an insulation region filled between the substrate region and the body region in FIG. 10; and FIGS. 12A through 12F are perspective views illustrating a method of manufacturing the semiconductor substrate in FIG. 9.

DETAILED DESCRIPTION OF EXAMPLE EMBODIMENTS

Figure 1:
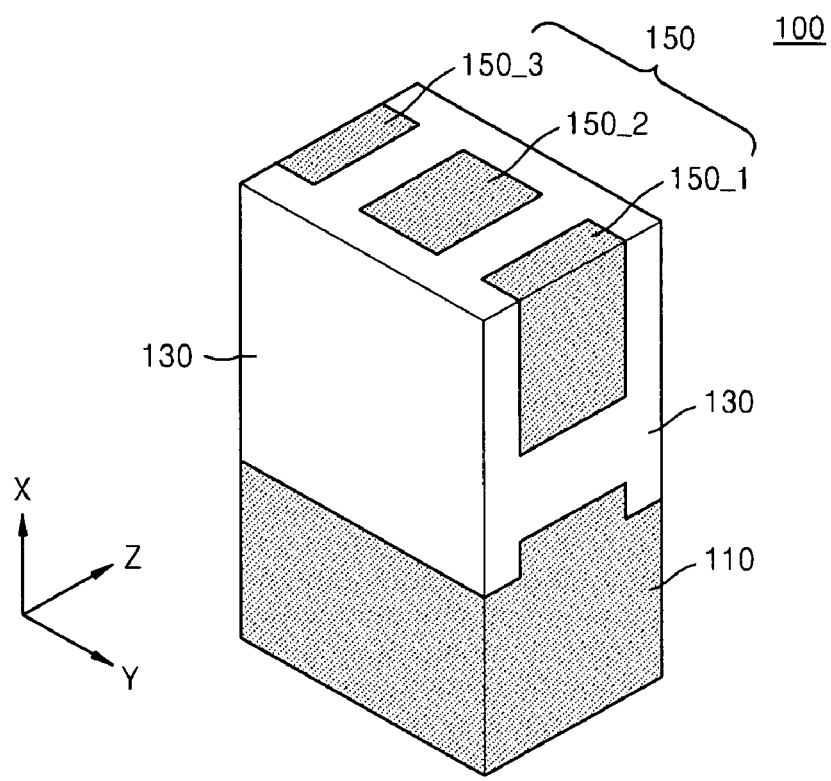

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments provide semiconductor substrates and methods of manufacturing a semiconductor substrate. Other example embodiments relate to semiconductor substrates including a floating body and methods of manufacturing a semiconductor substrate.

FIG. 1 is a perspective view of a semiconductor substrate 100 according to example embodiments.

Referring to FIG. 1, the semiconductor substrate 100 includes a substrate region 110, a body region 150 and/or an insulation region 130.

The insulation region 130 may be disposed on the substrate region 110. The body region 150 may be separated from the substrate region 110. The body region 150 may be disposed on the insulation region 130. The body region 150 may be a floating body region. The substrate region 110 and the body region 150 may be formed of materials having identical characteristics.

The insulation region 130 may be formed of a silicon oxide or another insulation material. The insulation region 130 may be formed of two or more insulation materials.

The semiconductor substrate 100 may include a plurality of body regions 150_1, 150_2, 150_3 (collectively referred to as the body region 150) that are arranged parallel to each other. A plurality of insulating layers (not shown) may be formed between the body regions 150_1, 150_2, 150_3. The insulating layers separate the body regions 150_1, 150_2,

150_3. The insulating layers disposed between the body regions 150_1, 150_2, 150_3 may be connected to the insulation region 130.

To manufacture the semiconductor substrate 100, a bulk substrate may be separated into an upper end portion and a lower end portion by selectively etching a center portion of the bulk substrate. The separated upper and lower end portions may be the body region 150 and the substrate region 110, respectively.

At least one of the body regions 150_1, 150_2, 150_3 may be formed by forming at least one body pattern (not shown) extending in a desired direction on the bulk substrate and etching a lower middle portion of the body pattern.

Figure 2:
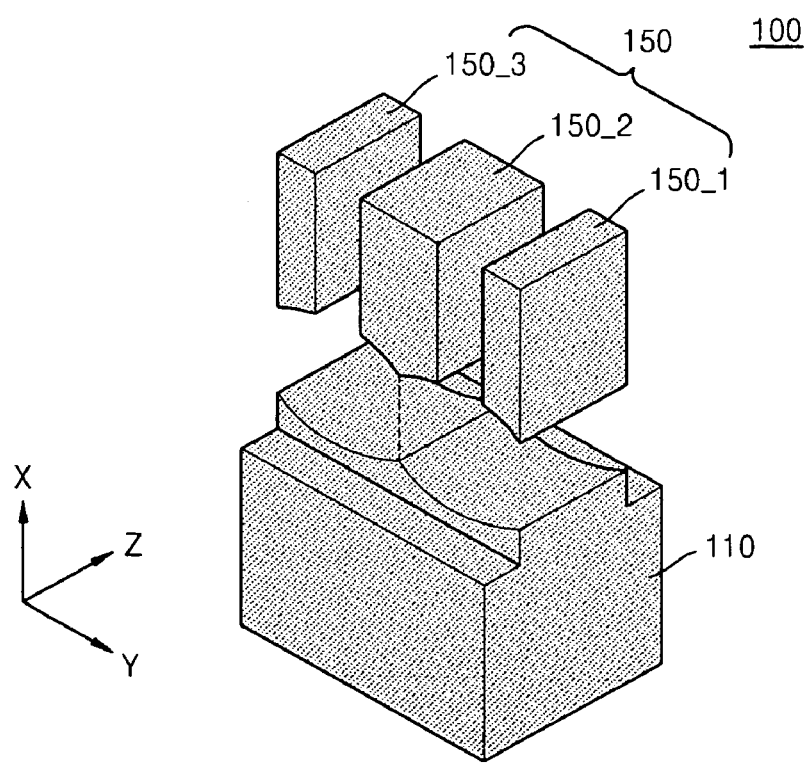
Figure 3:
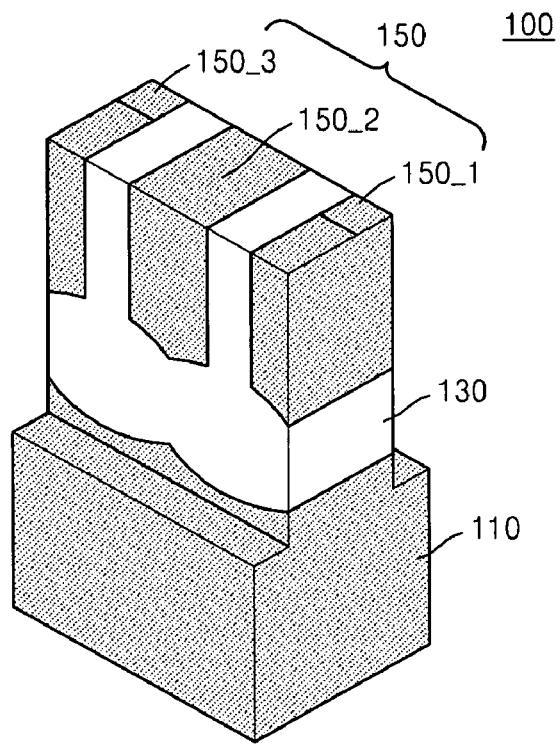

FIG. 2 illustrates the substrate region 110 and the body region 150 of the semiconductor substrate 100. FIG. 3 illustrates the insulation region 130 between the substrate region 110 and the body region 150 of semiconductor substrate 100.

Referring to FIGS. 2 and 3, the substrate region 110 and the body region 150 may be separated from each other. Because the substrate region 110 and the body region 150 are formed from an identical substrate, the substrate region 110 and the body region 150 include identical materials. A more detailed description of the process of etching the center portion of the substrate may be obtained by referring to the article entitled "Sphere-Shaped-Recess-Channel-Array Transistor (S-RCAT) Technology for 70 nm DRAM Feature Size and Beyond," 2005 Symposium on VLSI Technology Digest of Technical Papers, the entire contents of which are incorporated in this application.

If it is assumed that the body region 150 is manufactured through an epitaxial growing process on the substrate region 110, materials included in the body region 150 have different characteristics than materials included in the substrate region 110.

The semiconductor substrate according to example embodiments may be formed from a bulk semiconductor substrate. The body region 150 may be formed from a bulk semiconductor substrate by selectively etching a center portion of the bulk semiconductor substrate. Compared to a semiconductor substrate in which the insulation region is formed on the substrate region and the body region is formed on the insulation region through an epitaxial growing process, the semiconductor substrate according to example embodiments may be manufactured at lower costs.

Figure 4:
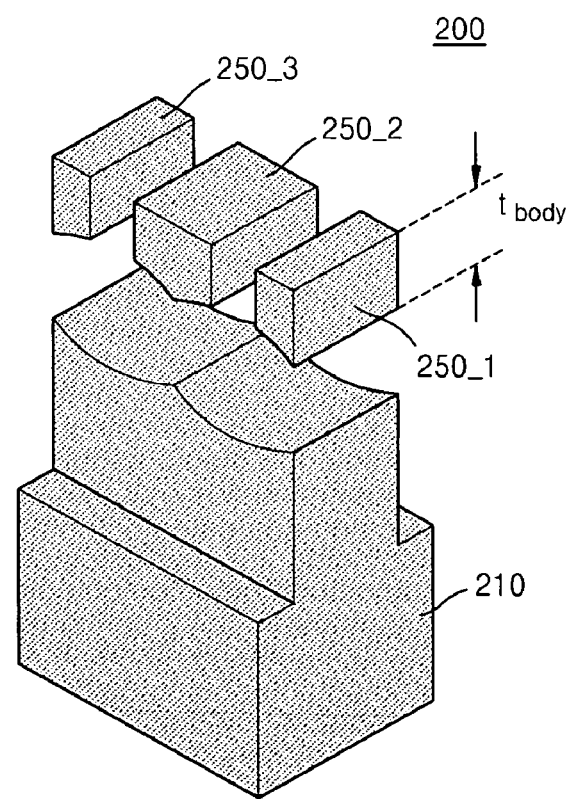

FIG. 4 illustrates a semiconductor substrate 200 according to example embodiments. A description of like elements in FIG. 4 as described above with reference to FIGS. 1-3 will be omitted for the sake of brevity.

Referring to FIG. 4, a body region 250 may be formed with a decreased thickness. The thickness of the body region 250 is smaller than the thickness of the body region 150 of the semiconductor substrate 100 shown in FIG. 1. According to example embodiments, the thickness of the body region of the semiconductor substrate may vary.

During manufacturing of the semiconductor substrate according to example embodiments, the thickness of the body region may be adjusted by adjusting the selective etching position. For example, the thickness of the body region 150 may be increased by selectively etching a region near a lower end portion of the bulk substrate. The thickness of the body region 250 may be reduced by selectively etching a region near an upper end portion of the bulk substrate.

If the body region is manufactured through an epitaxial growing process, the thickness of the body region may not exceed a desired thickness.

Figure 5:
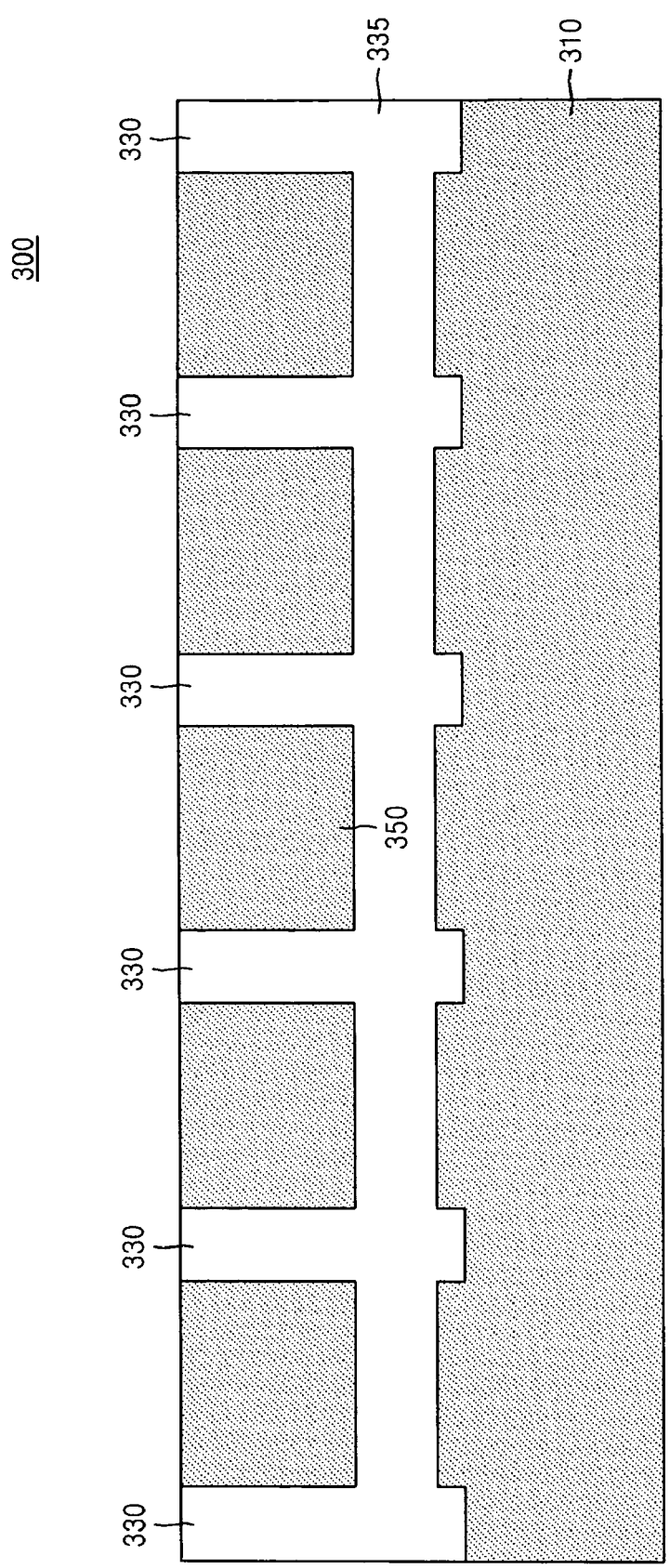

FIG. 5 illustrates a semiconductor substrate 300 according to example embodiments.

Referring to FIG. 5, a plurality of body regions 350 may be formed in the semiconductor substrate 300. By selectively etching a center portion of the semiconductor substrate 300, the body regions 350 may be separated from a substrate region 310. An insulating material may be filled between the body regions 350 and the substrate region 310 to form insulation regions 330.

The body regions 350 may be formed by forming a plurality of body patterns extending in a desired direction on the bulk substrate and etching regions of the bulk substrate below the body patterns.

In FIG. 5, the plurality of body regions 350 may be formed in one direction and uniform in size. However, example embodiments are not limited thereto. For example, the plurality of body regions 350 may be arranged in different directions and/or have different sizes as illustrated in FIGS. 1 through 3. For example, the plurality of body regions 150 may be arranged in an array on one substrate region 110.

FIGS. 6A through 6G are perspective views illustrating a method of manufacturing a semiconductor substrate 100 according to example embodiments.

Figure 6A:
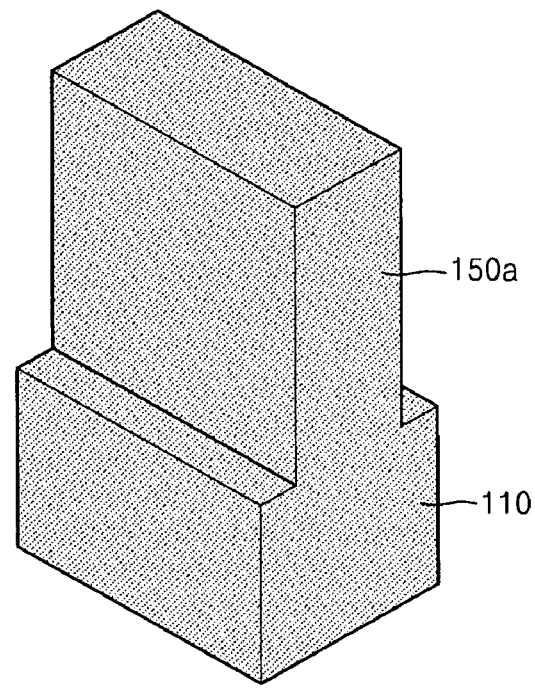
FIGS. 6A through 6G are perspective views illustrating a method of manufacturing the semiconductor substrate according to example embodiments.

Referring to FIG. 6A, the semiconductor substrate 100 may be patterned from upper end portions of the semiconductor substrate to a desired width and length. The semiconductor substrate 100 may be a bulk semiconductor substrate generated (or formed) from a bulk wafer.

Patterning the semiconductor substrate 100 forms a body line pattern 150a disposed between the patterned portions and a substrate region 110 below the body line pattern 150a. The patterning width may vary according to the desired width of the body line pattern 150a. The patterning length may vary according to the desired thickness of the body line pattern 150a.

Herein, the body region may be referred to as a body line pattern 150a (or body pattern 150b) before being separated from the substrate region 110, and a body region 150 after being separated from the substrate region 110.

Figure 6B:
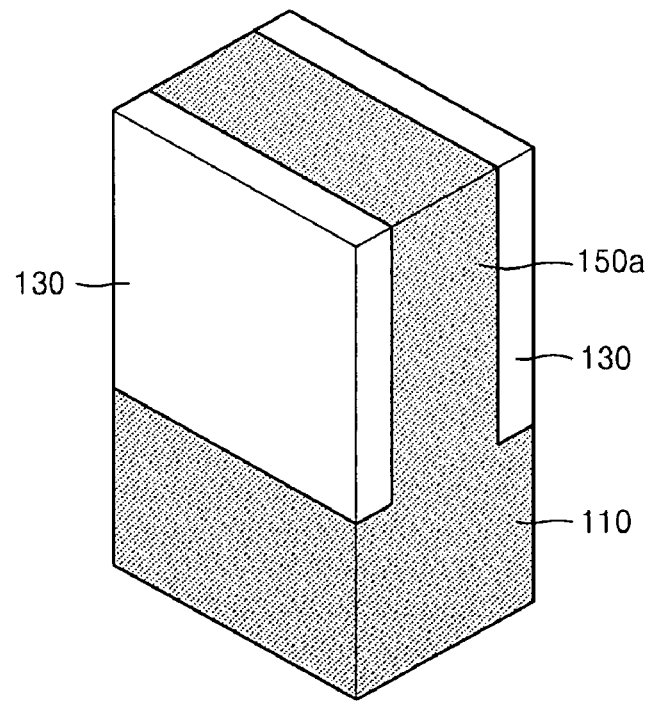

Referring to FIG. 6B, an insulating material may be filled in the patterned portions to form insulation regions 130. Insulation regions 130 may be disposed at sides of the body line pattern 150a. If the body line pattern 150a is separated from the substrate region 110 using a selective etching technology to form the body region 150, the insulation regions 130 may support the body region 150.

Figure 6C:
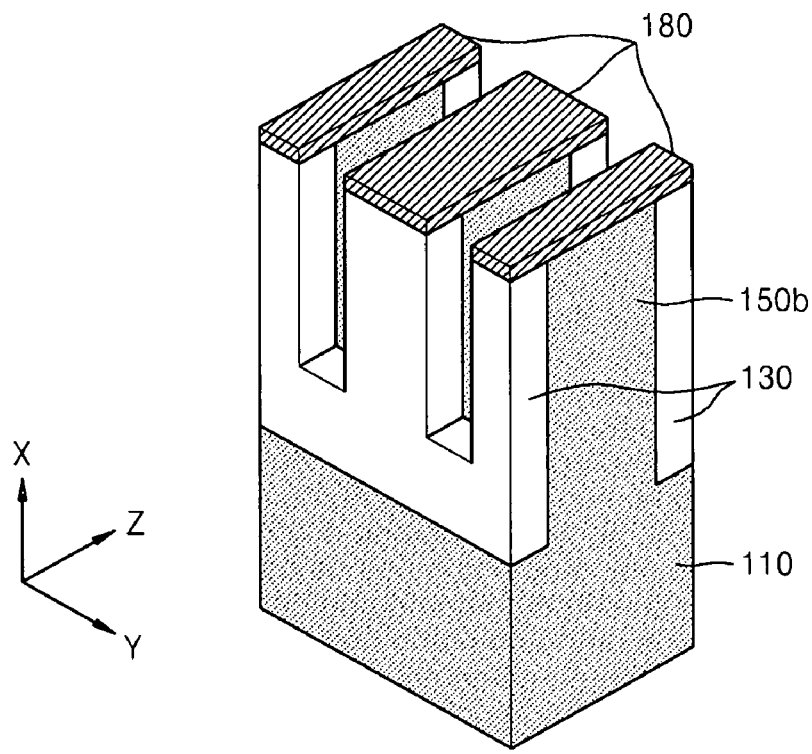

Referring to FIG. 6C, the body line pattern 150a and the insulation regions 130 may be patterned in a Z direction. The body line pattern 150a and the insulation regions 130 may be separated into a plurality of body patterns 150b and a plurality of insulation regions 130. In FIG. 6C, the body line pattern 150a and the insulation regions 130 may be patterned from a top of the body line pattern 150a and the insulation regions 130 to a desired length.

The region 150a illustrated in FIGS. 6A and 6B may be referred to as a body line pattern, and the region 150b illustrated in FIG. 6C may be referred to as body patterns.

Referring to FIG. 6A, a bulk substrate is patterned in a first direction (Y direction), which is a major axis direction, to form a body line pattern 150a extending in the first direction (Y direction).

Referring to FIG. 6B, sides of the body line pattern 150a in FIG. 6A may be filled with insulating regions (or layers) 130. Referring to FIG. 6C, the body line pattern 150a and the insulating regions 130 may be etched in a second direction (Z direction) that is perpendicular to the first direction (Y direction) in which the body line pattern 150a is extended to form at least one body pattern 150b extending in the second direction (Z direction).

The height of the body patterns 150b may be lower than that of the body line pattern 150a.

After forming a mask 180 on portions of the body patterns 150b and the insulation regions 130 (excluding portions to be patterned), a patterning process may be performed only on portions not covered by the mask 180. As such, portions that are not covered by the mask 180 may be patterned.

Figure 6D:
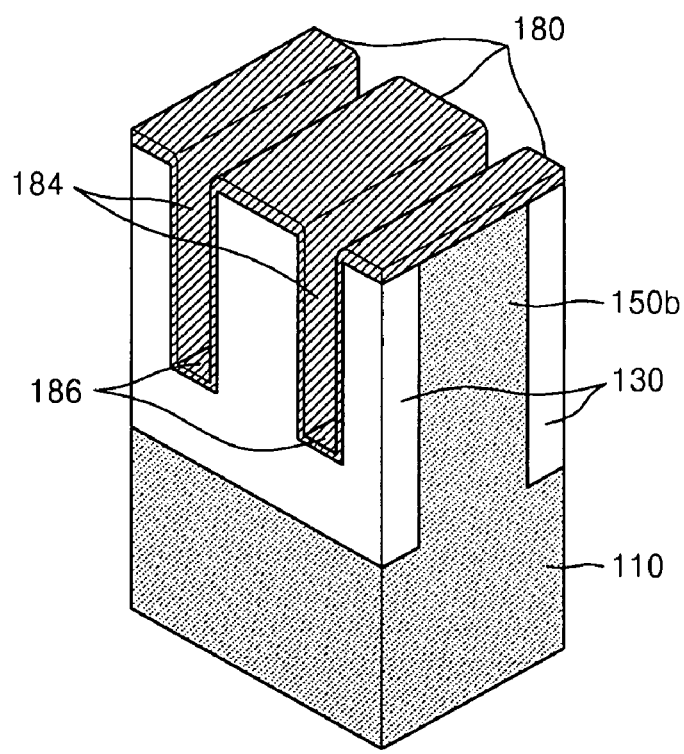
Figure 6E:
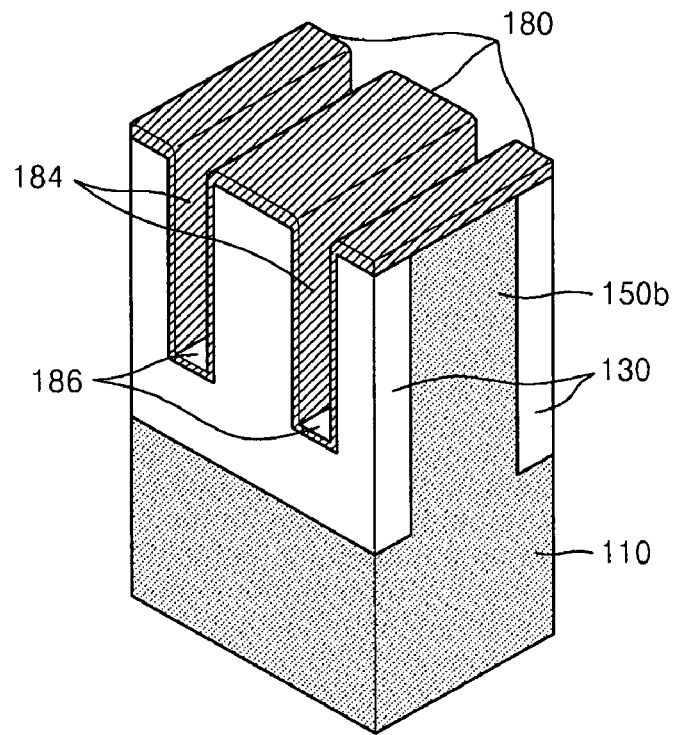

Referring to FIGS. 6D and 6E, patterned inner surfaces of the body patterns 150b and the insulation regions 130 may be covered by a first mask (a passivation layer) 184. Bottom surfaces of the body patterns 150b and the insulation regions 130 may be covered by a second mask 186. The second mask 186 on the bottom surfaces may be removed.

Figure 6F:
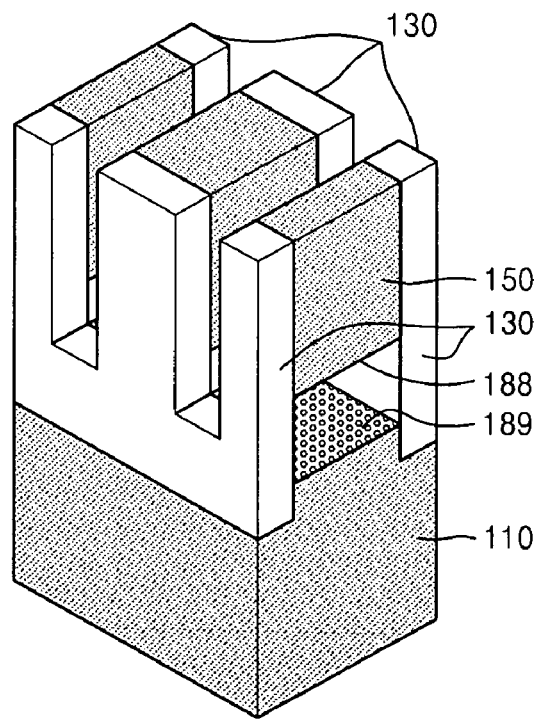

Referring to FIG. 6F, a lower middle portion of the body patterns 150b may be selectively etched, exposing a bottom surface 188 of the body patterns 150b and an upper surface 189 of the substrate region 110. The lower middle portion of the body patterns 150b may be selectively etched through the bottom surfaces 188, from which the second mask 186 has been removed.

After forming the first mask (the passivation layer) 184 on sidewalls of the body patterns 150b, the lower middle portion of the body pattern 150b may be etched through the bottom surfaces 188 (as shown in FIG. 6E), which are disposed on sides of the body patterns 150b and on which the first mask (the passivation layer) 184 is not formed. As such, the bulk substrate may be separated into a substrate region 110 and a body region 150. The substrate region 110 may be disposed under the selectively etched region and the body region 150 may be disposed on the selectively etched region.

The selective etching process may be a selective wet etching method or a selective dry etching method, which is used to etch the lower middle portion of the body patterns 150b.

Figure 6G:
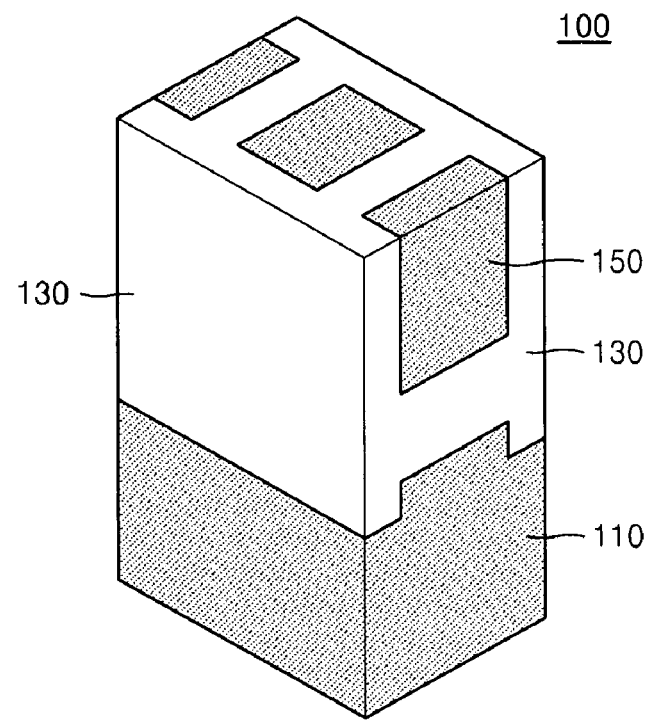

Referring to FIG. 6G, the selectively etched region of the body patterns 150b and the substrate region 100 may be filled with an insulating material. After removing the first mask (the passivation layer) 184 on top surfaces and sidewalls of the body patterns 150b, the selectively etched region may be filled with an insulating material. Spaces between the body patterns 150b may be filled with the insulating material.

The process illustrated in FIGS. 6A through 6G may be used to manufacture the semiconductor substrate 300 of FIG. 5 in which a plurality of body regions are formed. For example, similar to FIG. 6A, several portions of the bulk substrate illustrated in FIG. 5 may be etched parallel to each other in the first direction to form a plurality of body line patterns extending parallel to each other in the first direction. As shown in FIG. 6B, insulating layers may be filled between the body line patterns. As shown in FIG. 6C, the bulk substrate may be etched in the second direction, which is perpendicular to the first direction, to form a plurality of body patterns extending parallel to each other in the second direction. (In FIG. 5, one body pattern from among the plurality of body patterns formed from a body line pattern is illustrated.) As shown in FIG. 6D, a passivation layer may be formed on sidewalls of the body patterns. As shown in FIG. 6F, the lower middle portion of the body patterns may be etched through a bottom surface wherein the passivation layer disposed between the body patterns is not formed. As shown in FIG. 6G, the etched regions and spaces between the body patterns may be filled with an insulating material.

Figure 7:
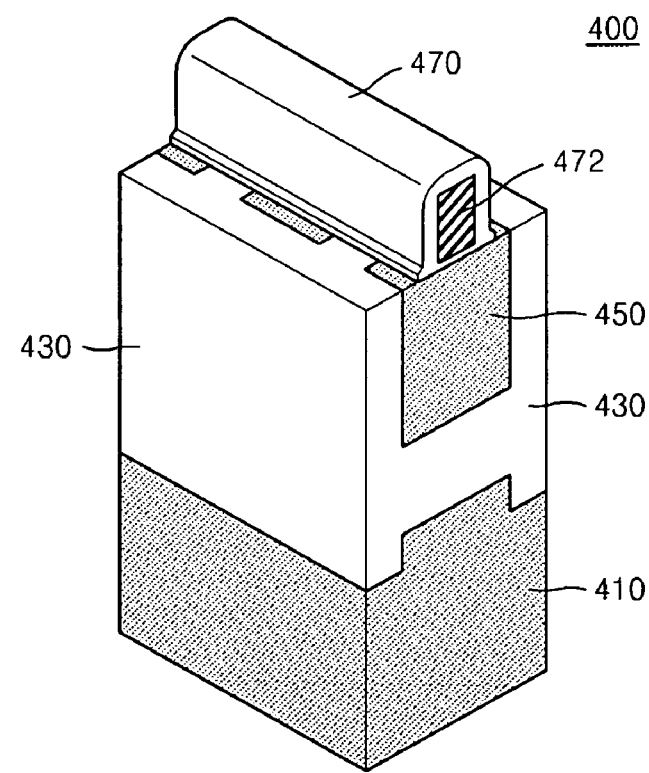

FIG. 7 illustrates a word line pattern formed on a semiconductor substrate 400 according to example embodiments.

In FIG. 7, a substrate region 410, a body region 450 and an insulation region 430 are formed using a similar method as described with reference to semiconductor substrate 100. Thus, a description of like elements will not be repeated for the sake of brevity.

Referring to FIG. 7, in the semiconductor substrate 400, a word line pattern 472 may be formed on (or over) the body region 450. A plurality of impurity doping regions (not shown) may be formed on the body region 450. Semiconductor devices according to example embodiments may be used as a bipolar junction transistor (BJT). If the semiconductor substrate 400 is used a BJT, a portion of the word line pattern 472 may function as a base of a transistor. For example, the portion of the word line pattern 472 passing (or over) an upper end of the body region 450 may function as the base of the transistor. The impurity doping regions (not shown) may respectively function as an emitter and collector.

However, example embodiments are not limited thereto. The semiconductor devices according to example embodiments may be realized as various circuit devices other than the BJT. For example, the semiconductor devices may be realized as another type of transistor, a memory device, a sensor or a switching unit structure. As such, a pattern other than the word line pattern 472 may be formed on (or over) the body region 450.

FIGS. 8A through 8G are perspective views illustrating a method of manufacturing a semiconductor substrate 800 according to example embodiments.

Figure 8A:
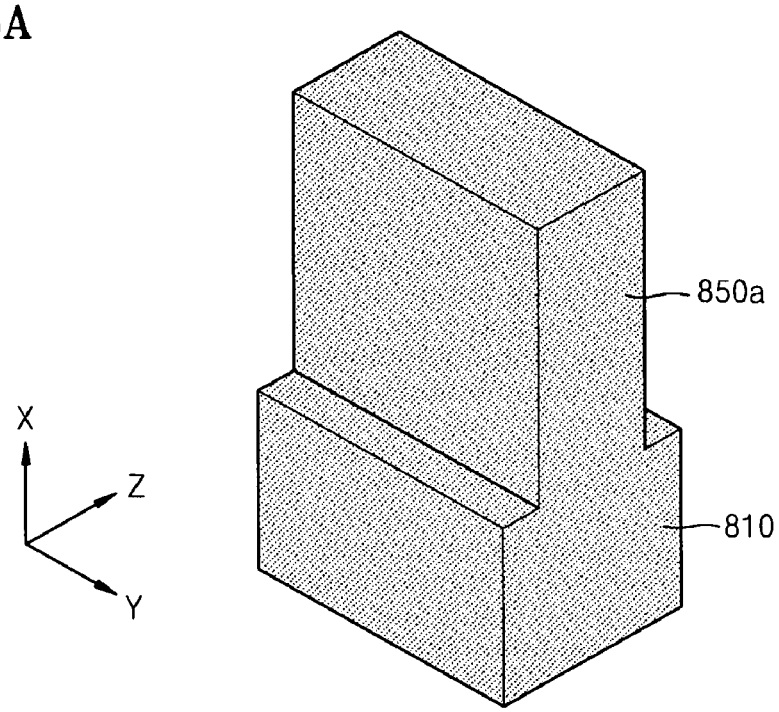
FIGS. 8A through 8G are perspective views illustrating a method of manufacturing a semiconductor substrate according to example embodiments.

Referring to FIG. 8A, a bulk substrate may be etched in a first direction (Y direction), which is a major axis direction, to form a body line pattern 850a extended in the first direction (Y direction).

Figure 8B:
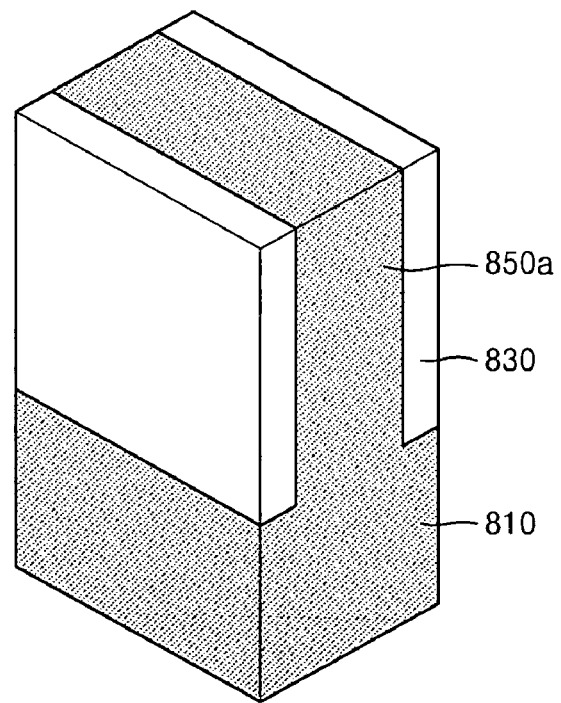

Referring to FIG. 8B, sides of the body line pattern 850a may be filled with insulating layers 830. As the processes of FIGS. 8A and 8B are identical to the processes of FIGS. 6A and 6B, description of like elements thereof will be omitted for the sake of brevity.

Figure 8C:
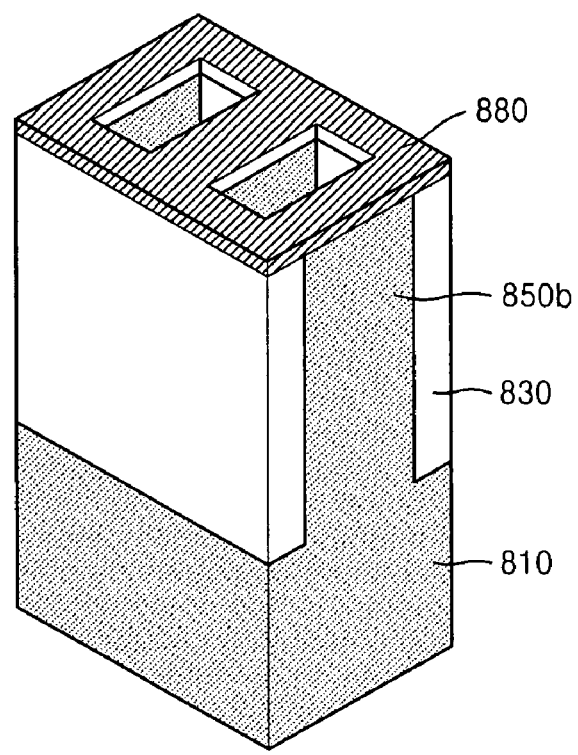

Referring to FIG. 8C, the body line pattern 850a illustrated in FIG. 8B is patterned in a Z direction. At least one body pattern 850b may be formed by etching the body line pattern 850a (excluding the insulating layers 830) in the first direction (Y direction) in which the body line pattern 850a is extended and in the second direction (Z direction) that is perpendicular to the first direction. The insulation layer 830 is not patterned in FIG. 8C. In FIG. 8C, the body pattern 850b may be patterned to a desired length from a top surface of the body pattern 850b.

After forming a mask 880 on portions of the body pattern 850b (excluding portions to be patterned) and on the insulation region 830, portions that are not covered by the mask 880 may be patterned.

Figure 8D:
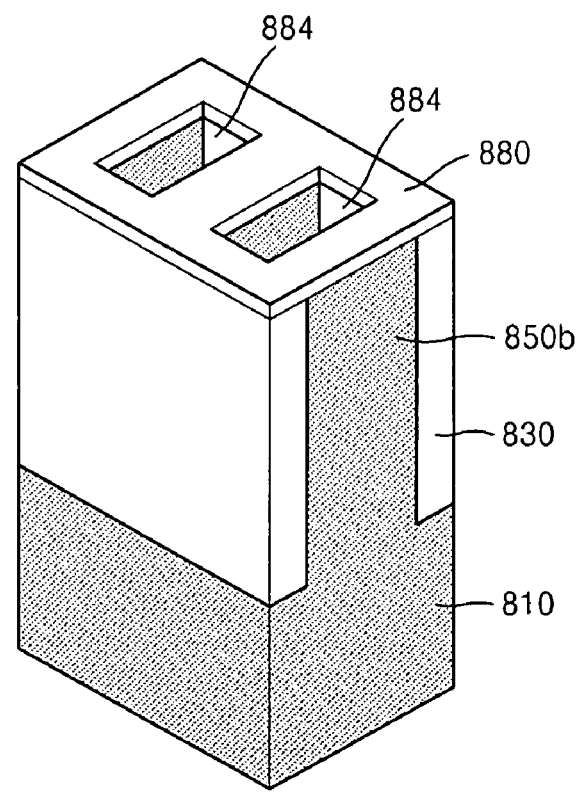
Figure 8E:
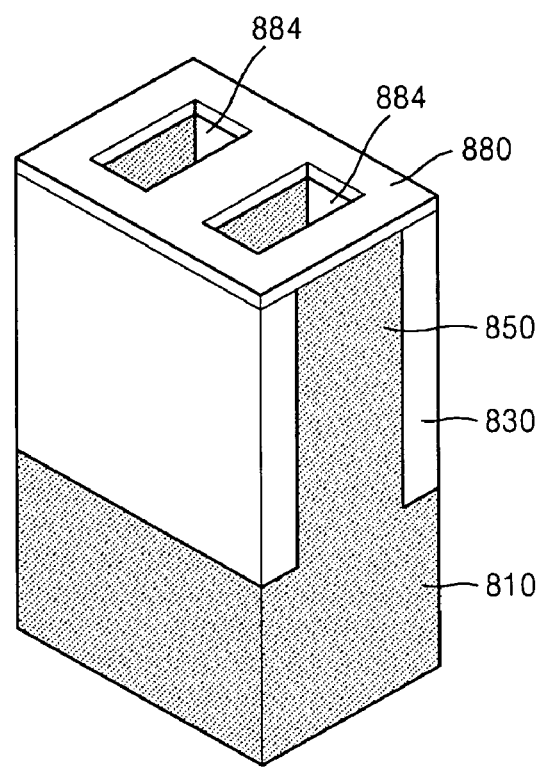

Referring to FIGS. 8D and 8E, patterned inner surfaces 884 and bottom surfaces (not shown) of the body pattern 850b and the insulation region 830 may be masked. The mask on the bottom surfaces (not shown) may be removed. A lower middle portion of the body pattern 850b may be selectively etched through the bottom surface, from which the masking is removed.

Figure 8F:
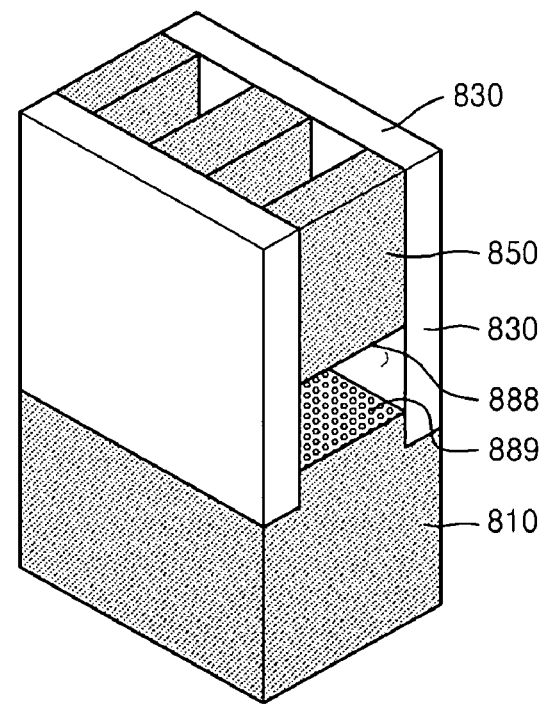

Referring to FIG. 8F, the lower middle portion of the body pattern 850b may be selectively etched, exposing a bottom surface 888 of the body pattern 850b and an upper surface 889 of the substrate region 810.

Figure 8G:
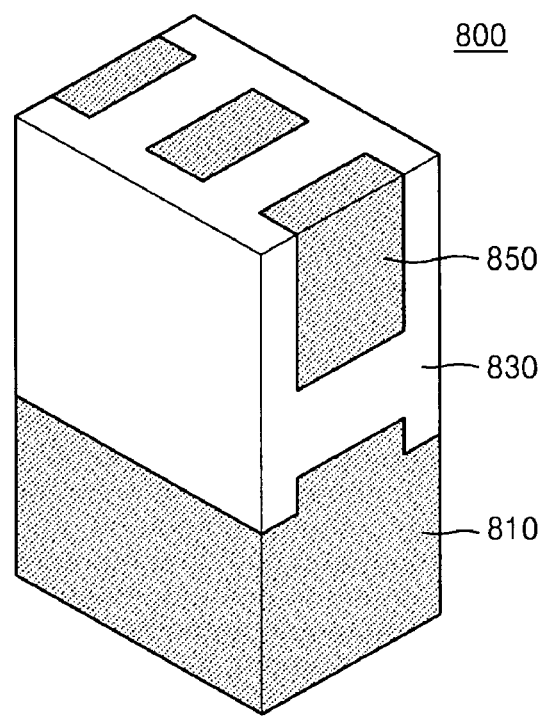

Referring to FIG. 8G, the selectively etched region of the body pattern 850b and the substrate region 810 may be filled with an insulating material. As such, the semiconductor 800 of FIG. 8G and the semiconductor substrate 100 of FIG. 6G may have the same form (or structure).

Figure 9:
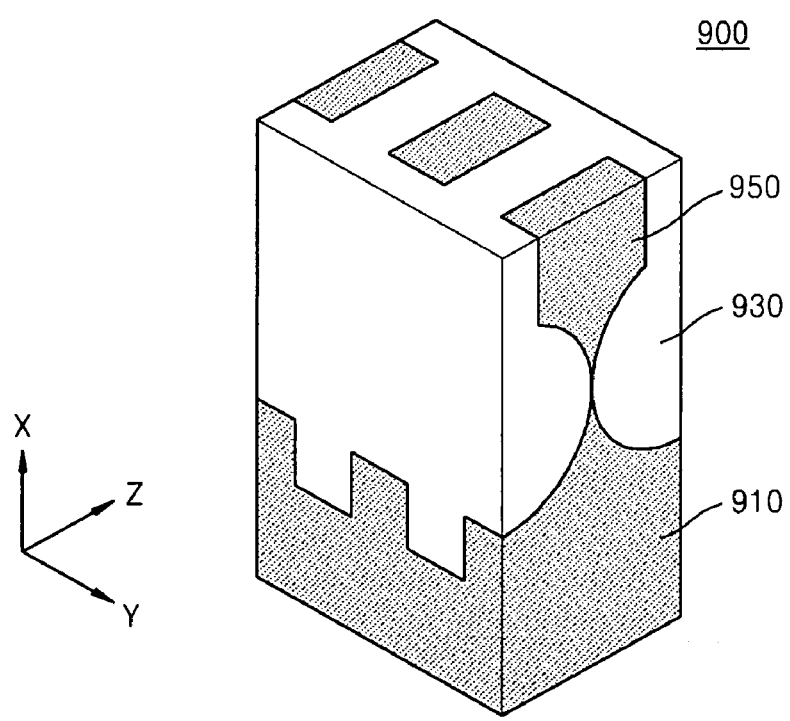

FIG. 9 is a perspective view of a semiconductor substrate 900 according to example embodiments.

Figure 10:
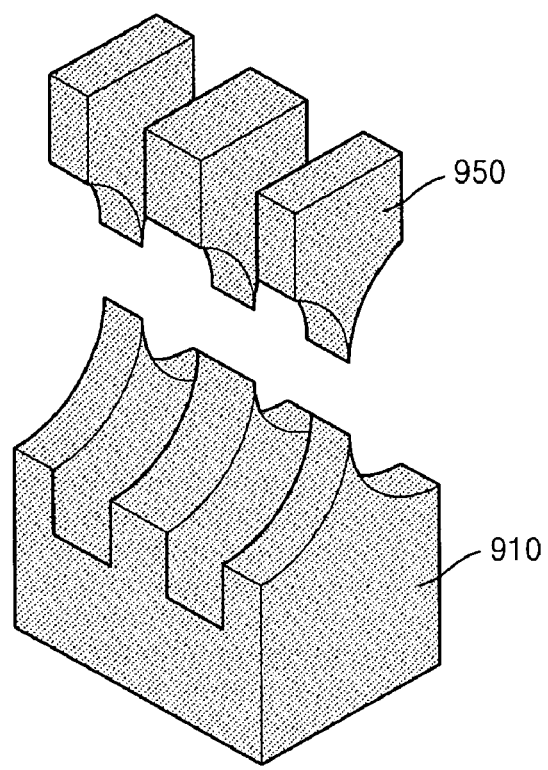

FIG. 10 illustrates a substrate region and a body region of the semiconductor substrate 900.

Figure 11:
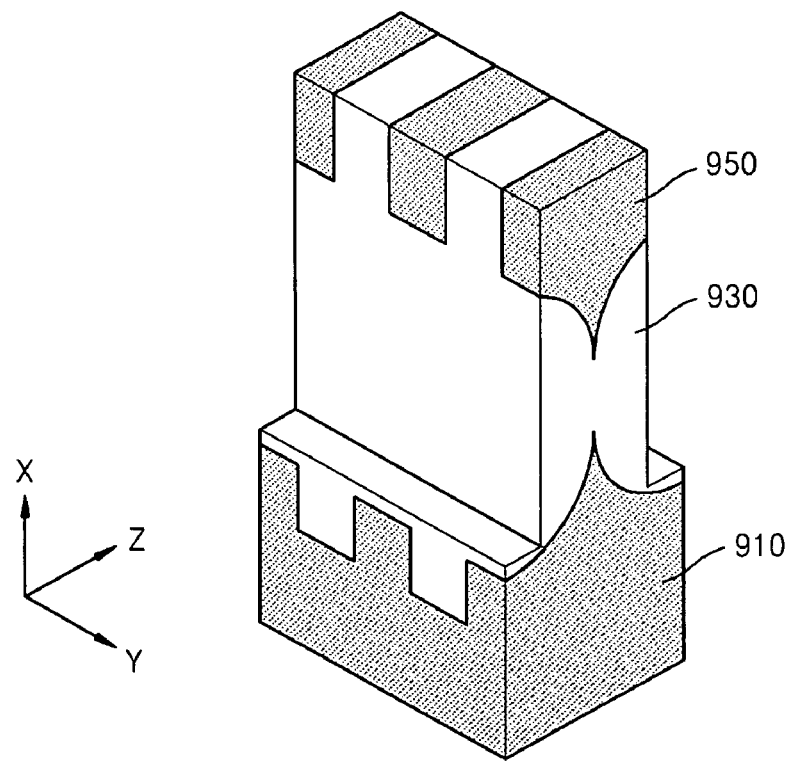

FIG. 11 illustrates an insulation region between the substrate region and the body region of the semiconductor substrate 900.

In the manufacturing process of the semiconductor substrate 900 illustrated in FIGS. 9 through 11, the direction of the selective etching process is different from the manufacturing process of the semiconductor substrate 100 illustrated in FIGS. 1 through 3. In the manufacturing process of the semiconductor substrate 100 illustrated in FIGS. 1 through 3, the direction of the selective etching is along the Z-axis direction. In the manufacturing process of the semiconductor substrate 900 illustrated in FIGS. 9 through 11, the direction of the selective etching is along the Y-axis direction.

In the semiconductor substrate 900 illustrated in FIGS. 9 through 11, a body region 950 may be separated from a substrate region 910. The body region 950 may be disposed on an insulation region 930. Materials included in the body region 950 have identical characteristics as materials included in the substrate region 910.

The thickness of the body region 950 may be adjusted by adjusting the selective etching position.

FIGS. 12A through 12F are perspective views illustrating a method of manufacturing the semiconductor substrate 900. In FIG. 9.

Figure 12A:
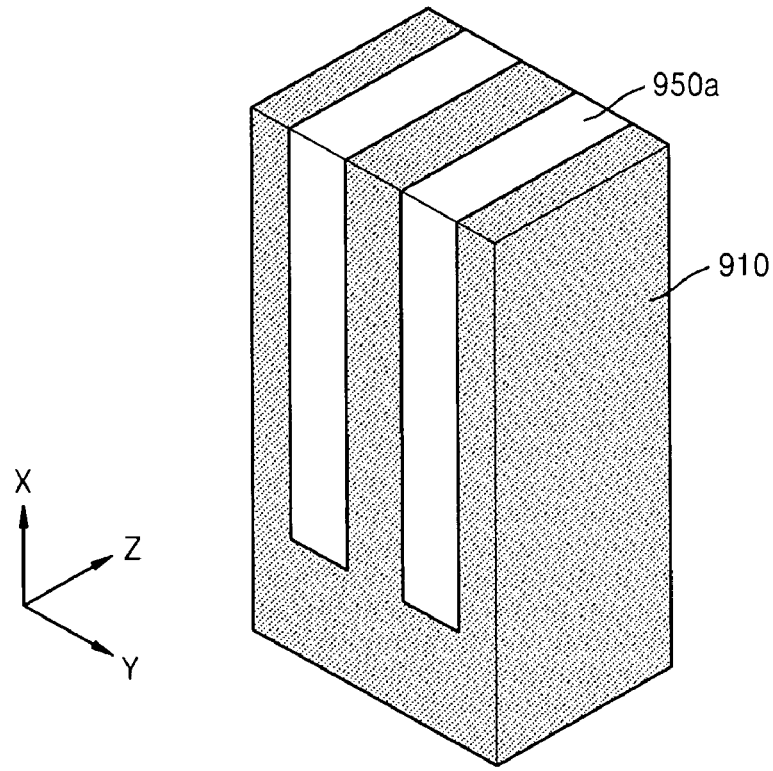

Referring to FIG. 12A, insulation regions 930 may formed on the semiconductor substrate 900. The insulation regions 930 may be formed in a substrate region 910. A bulk substrate may be etched in along the minor axis direction (z-axis direction) to form a plurality of body line patterns 950a that extend in the minor axis direction (z-axis direction). The insulation regions 930 may be filled between the body line patterns 950a. The bulk substrate may be divided into the body line patterns 950a, which are formed from a top surface of the bulk substrate to the bottom surface of the insulation regions 930, and the substrate region 910, which is the remaining lower portion of the bulk substrate. The body line patterns 950a and the insulation regions 930 may have the same length.

Figure 12B:
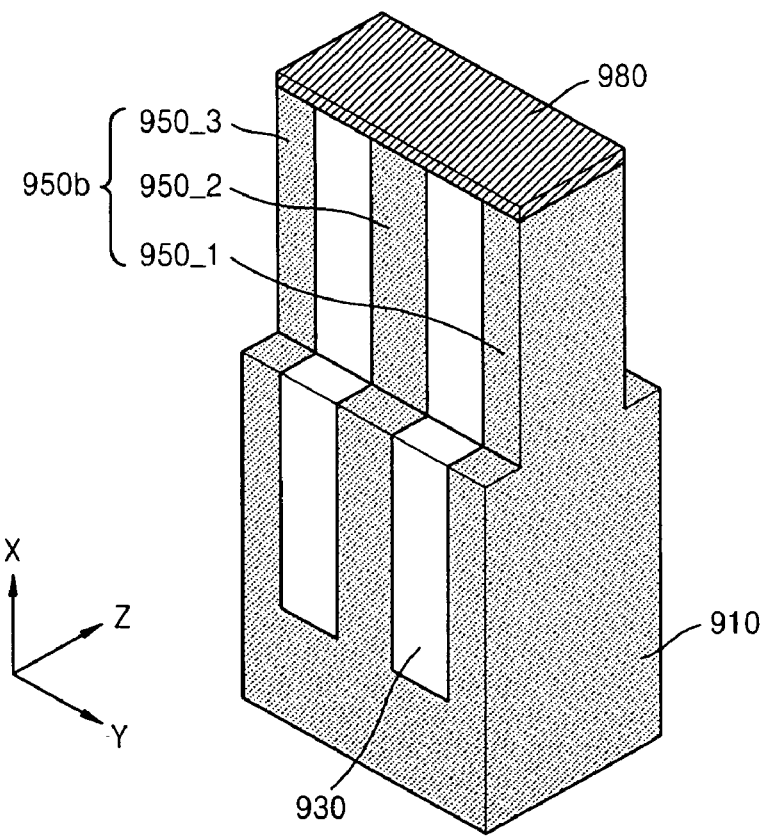

Referring to FIG. 12B, the bulk substrate is patterned from upper end portions (or sidewalls) of the bulk substrate to a desired width and length. The body line patterns 950a and the insulation regions 930 may be patterned simultaneously to form a plurality of body patterns 950_1, 950_2 and 950_3, collectively denoted as body pattern 950b, on the substrate region 910. Sides of the body line patterns 950a and the insulation regions 930 may be etched in a Y direction that is perpendicular to the Z direction in which the body line patterns 950a extend. As such, the plurality of body patterns 950b extending in the Z direction are formed.

After forming a first mask 980 over portions of the body patterns 950b and the insulation regions 930 (excluding portions to be patterned), portions that are not covered with the first mask 980 may be patterned. For example, the mask 980 may be formed on sidewalls of the body patterns 950b.

Figure 12C:
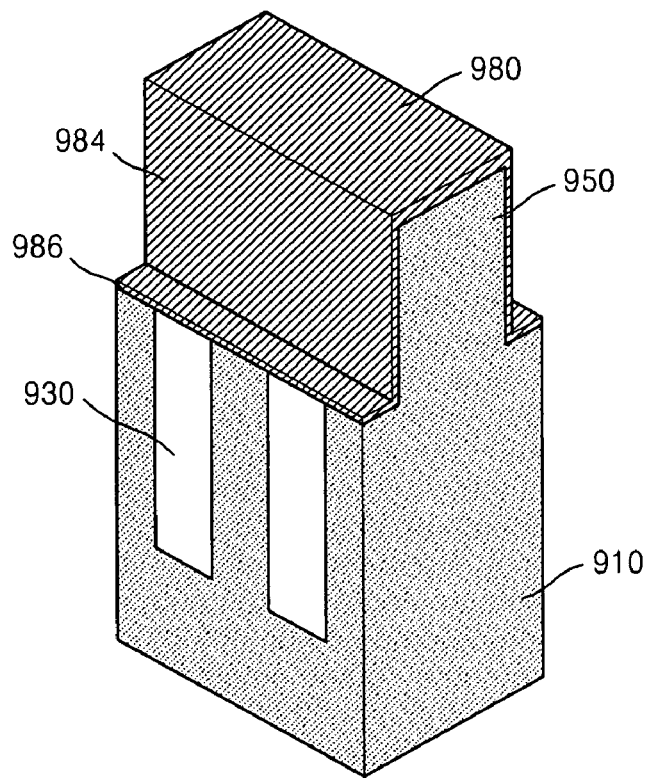

Referring to FIG. 12C, a second mask 984 may be formed over sides of the body patterns 950b. A third mask 986 may be formed over exposed tops of the substrate region 910 and the insulation regions 930.

Figure 12D:
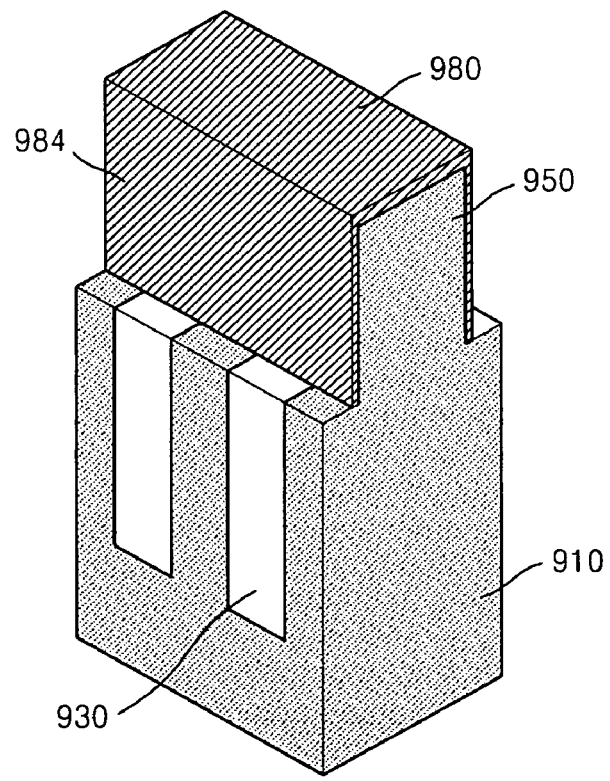

Referring to FIG. 12D, the third mask 986 covering the exposed tops of the substrate region 910 and the insulation regions 930 may be removed.

Figure 12E:
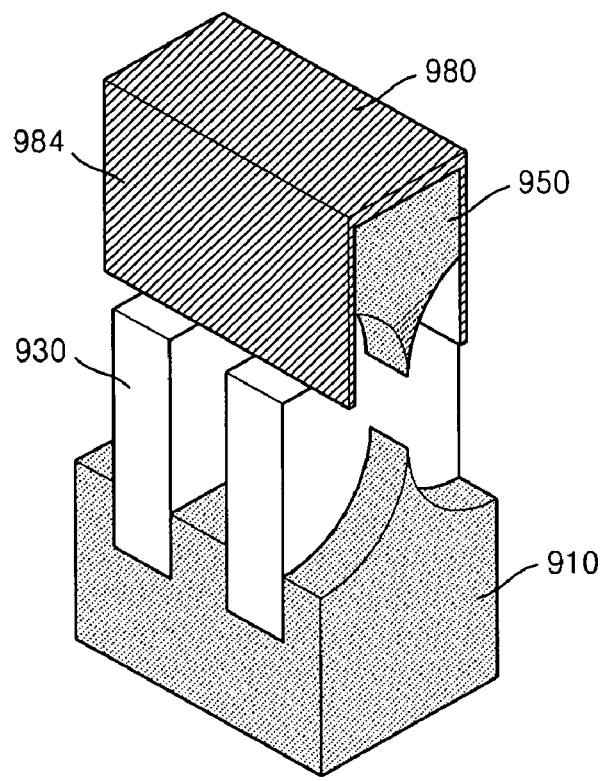

Referring to FIG. 12E, a plurality of body regions 950 may be formed by selectively etching a lower middle portion of the body patterns 950b through the portions from which the mask 986 has been removed. Because a selective etching technique is used, the insulation regions 930 are not etched. The lower middle portion of the body patterns 950b may be etched through top surfaces of the substrate region 910, which are disposed on sides of the body patterns 950b and have no mask (passivation layer) formed thereon.

Figure 12F:
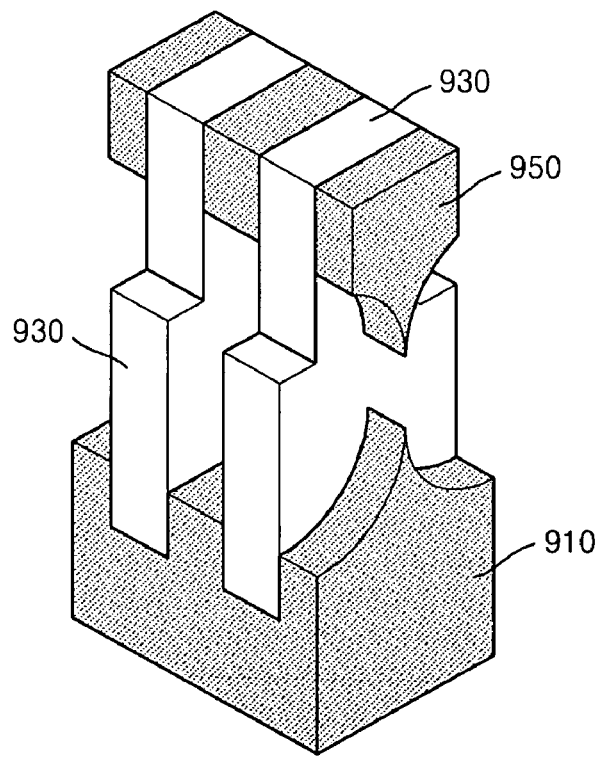

Referring to FIG. 12F, the mask 980 may be removed. The selective etching region may be filled with an insulating material to form the semiconductor substrate 900 illustrated in FIG. 9. Namely, the masks 980 and 984 (the passivation layer) formed on top surfaces and sidewalls of the body regions 950 may be removed. The selectively etched region below the body regions 950 and spaces between the body regions 950 may be filled with the insulating material.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor substrate comprising:
    forming at least one floating body pattern by etching a bulk substrate;
    separating the bulk substrate into a substrate region and a floating body region by selectively etching a middle portion of the at least one floating body pattern; and
    filling between the floating body region and the substrate region with an insulating material,
    wherein forming the at least one floating body pattern includes,
        forming a floating body line pattern by etching the bulk substrate in a first direction, the first direction extending along a major axis direction of the bulk substrate and the at least one floating body line pattern extending in the first direction,
        forming an insulating layer on sidewalls of the floating body line pattern, and
        etching the floating body line pattern and the insulating layer in a second direction perpendicular to the first direction, the at least one floating body pattern extending in the second direction.

2. The method of claim 1, wherein separating the bulk substrate includes forming the substrate region under an etched portion of the at least one floating body pattern, the floating body region being over the substrate region.

3. The method of claim 1, wherein separating the bulk substrate includes:
    forming a passivation layer on an upper surface and sidewalls of the floating body pattern; and
    etching the middle portion of the floating body pattern through a lower portion of the floating body pattern where the passivation layer is not formed.

4. The method of claim 3, wherein filling the sides of the floating body line pattern with the insulating layer includes:
    removing the passivation layer on the upper surface and the sidewalls of the floating body pattern; and filling below the etched portion of the floating body pattern and spaces on sides of the floating body pattern with an insulating material.

5. The method of claim 1, wherein a height of the floating body pattern is lower than a height of the floating body line pattern.

6. The method of claim 1, wherein separating the bulk substrate includes etching the middle portion of the floating body pattern using a selective wet or dry etching method.

7. A method of manufacturing a semiconductor substrate comprising:
forming at least one floating body pattern by etching a bulk substrate;
separating the bulk substrate into a substrate region and a floating body region by selectively etching a middle portion of the at least one floating body pattern: and
filling between the floating body region and the substrate region with an insulating material,
wherein forming the at least one floating body pattern includes
forming a plurality of floating body line patterns extending parallel to each other in a first direction by etching the bulk substrate in the first direction,
filling between the plurality of floating body line patterns with an insulating layer, and
forming a plurality of the floating body patterns by etching the bulk substrate in a second direction perpendicular to the first direction, the plurality of floating body patterns extending parallel to each other in the second direction.

8. The method of claim 7, wherein separating the bulk substrate includes:
forming a passivation layer on sidewalls of the floating body patterns; and
selectively etching the middle portion of the floating body patterns through a lower portion of the floating body patterns where the passivation layer is not formed.

9. A method of manufacturing a semiconductor substrate comprising:
forming at least one floating body pattern by etching a bulk substrate;
separating the bulk substrate into a substrate region and a floating body region by selectively etching a middle portion of the at least one floating body pattern; and
filling between the floating body region and the substrate region with an insulating material,
wherein forming the at least one floating body pattern includes:
forming a floating body line pattern by etching the bulk substrate in a first direction, the first direction extending along a major axis direction of the bulk substrate,
forming an insulating layer on sidewalls of the floating body line pattern, an
etching the bulk substrate, without etching the insulating layer, in a second direction perpendicular to the first direction, the least one floating body pattern extending in the second direction.

10. The method of claim 9, wherein separating the bulk substrate includes:
forming a passivation layer on sidewalls of the floating body pattern; and selectively etching the middle portion of the floating body pattern through a lower portion of the floating body pattern where the passivation layer is not formed.

11. A method of manufacturing a semiconductor substrate comprising:
forming at least one floating body pattern by etching a bulk substrate:
separating the bulk substrate into a substrate region and a floating body region by selectively etching a middle portion of the at least one floating body pattern: and
filling between the floating body region and the substrate region with an insulating material,
wherein forming the at least one floating body pattern includes
forming a plurality of floating body line patterns by etching the bulk substrate in a first direction, which extends along a minor axis direction of the bulk substrate, the plurality of floating body line patterns extending in the first direction,
filling between the plurality of floating body line patterns with an insulating layer, and
forming a plurality of the floating body patterns by etching sides of the floating body line patterns and the insulating layers in a second direction that is perpendicular to the first direction, the plurality of floating body patterns extending in the first direction.

12. The method of claim 11, wherein separating the bulk substrate includes:
forming a passivation layer on an upper surface and sidewalls of the floating body patterns; and
selectively etching the middle portion of the floating body patterns through a upper surface of the substrate region where the passivation layer is not formed.

13. The method of claim 12, wherein filling between the floating body region and the substrate region includes:
removing the passivation layer on an upper surface and the sidewalls of the floating body patterns; and
filling below an etched portion of the floating body patterns and spaces between the floating body patterns with an insulating material.

14. The method of claim 7, wherein separating the bulk substrate includes forming the substrate region under an etched portion of the at least one floating body pattern, the floating body region being over the substrate region.

15. The method of claim 7, wherein separating the bulk substrate includes etching the middle portion of the floating body pattern using a selective wet or dry etching method.

16. The method of claim 9, wherein separating the bulk substrate includes forming the substrate region under an etched portion of the at least one floating body pattern, the floating body region being over the substrate region.

17. The method of claim 9, wherein separating the bulk substrate includes etching the middle portion of the floating body pattern using a selective wet or dry etching method.

18. The method of claim 11, wherein separating the bulk substrate includes forming the substrate region under an etched portion of the at least one floating body pattern, the floating body region being over the substrate region.

19. The method of claim 11, wherein separating the bulk substrate includes etching the middle portion of the floating body pattern using a selective wet or dry etching method.

* * * * *